US011024355B1

(12) United States Patent
Jabeur et al.

(10) Patent No.: US 11,024,355 B1
(45) Date of Patent: Jun. 1, 2021

(54) MRAM BIT LINE WRITE CONTROL WITH SOURCE FOLLOWER

(71) Applicant: International Business Machines Corporation, Armonk, NY (US)

(72) Inventors: Kotb Jabeur, Essex Junction, VT (US); Ryan A. Jurasek, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/778,540

(22) Filed: Jan. 31, 2020

(51) Int. Cl.
*G11C 11/16* (2006.01)
*G11C 11/56* (2006.01)

(52) U.S. Cl.
CPC ...... *G11C 11/1673* (2013.01); *G11C 11/1655* (2013.01); *G11C 11/1675* (2013.01); *G11C 11/1697* (2013.01); *G11C 11/5607* (2013.01)

(58) Field of Classification Search
None
See application file for complete search history.

(56) References Cited

U.S. PATENT DOCUMENTS

| 7,239,537 | B2 | 7/2007 | DeBrosse et al. |
| 7,539,068 | B2 | 5/2009 | Wang et al. |
| 8,031,516 | B2 | 10/2011 | Tang |
| 8,411,484 | B2 * | 4/2013 | Aoki ............... G11C 13/0007 365/148 |
| 8,929,132 | B2 | 1/2015 | Alam et al. |
| 9,047,965 | B2 | 6/2015 | Alam et al. |
| 9,123,414 | B2 | 9/2015 | Kitagawa et al. |
| 9,257,177 | B2 | 2/2016 | Foong et al. |
| 9,336,881 | B2 | 5/2016 | Shimakawa et al. |
| 9,666,258 | B2 | 5/2017 | DeBrosse |
| 9,847,116 | B2 * | 12/2017 | Gogl ............... G11C 11/1675 365/158 |
| 2013/0155763 | A1 * | 6/2013 | Alam ............... G11C 11/1653 365/158 |

OTHER PUBLICATIONS

Shivam Verma et al., "Performance Enhancement of STT MRAM Using Asymmetric-k Sidewall-Spacer NMOS," IEEE Transactions on Electron Devices, vol. 63, No. 7, 2016, pp. 2771-2776.

* cited by examiner

*Primary Examiner* — James G Norman
(74) *Attorney, Agent, or Firm* — Scully, Scott, Murphy & Presser, PC; Daniel P. Morris, Esq.

(57) ABSTRACT

An MRAM bitline write control circuit including an MRAM array of a plurality of MTJ cells. Each MTJ cell is connected to a bitline between a bitline transfer gate and a transfer device. Each transfer device is connected to a sourceline and a sourceline transfer gate. A master bitline is connected to each bitline transfer gate. A first bitline control transistor is connected to VDD and to a source follower transistor that is connected to the master bitline and a gate connected to a write 0 bias voltage. A second bitline control transistor is connected to VSS and to the master bitline. A selected MTJ cell is biased to write a 0 when the transfer device, the bitline transfer gate and the source line transfer gate, associated with the selected MTJ cell, are enabled and the first bitline control transistor is enabled to connect the source follower transistor to VDD.

20 Claims, 7 Drawing Sheets

MRAM BIT LINE WRITE CONTROL WITH SOURCE FOLLOWER

BACKGROUND OF THE INVENTION

This disclosure relates to MRAM read/write circuits and more particularly to bit line write control.

A magnetoresistive random access memory (MRAM) includes an array of magnetoresistive memory elements. Each magnetoresistive memory element typically has a structure that includes multiple magnetic layers separated by various non-magnetic layers, such as a magnetic tunnel junction (MTJ), and exhibits an electrical resistance that depends on the magnetic state of the device. Information is stored as directions of magnetization vectors in the magnetic layers. Magnetization vectors in one magnetic layer are magnetically fixed or pinned, while the magnetization direction of another magnetic layer may be free to switch between the same and opposite directions that are called "parallel" and "antiparallel" states, respectively. Corresponding to the parallel and antiparallel magnetic states, the magnetic memory element has low (logic "0" state) and high (logic "1" state) electrical resistance states, respectively. Accordingly, a detection of the resistance allows a magnetoresistive memory element, such as an MTJ device, to provide information stored in the magnetic memory element. A high magnetoresistance (MR) value, which is the ratio of the resistance difference of the two states to the low resistance state, is desirable for increasing sensing signal and fast read operation.

Accurate Power delivery for writing an array of MTJ devices can be challenging due to the high power necessary. There are two configurations necessary to write a logical 1 and 0. Historically, to write a 0, a positive voltage is applied on the bit line, while the source line is at ground, and the access device operates as a switch. To write a 1, a positive voltage is applied on the source line, while the bit line is at ground, and the access device operates as a source follower.

Using a voltage source with distributed switches (write '0') creates the challenge of delivering an accurate supply to all MTJs that are being written in parallel. This can be challenging when the array become significantly large and the summation of current can cause significant bussing IR drop, as well as challenging regulator response.

SUMMARY OF THE INVENTION

In one embodiment, an MRAM bit line write control circuit is disclosed. The circuit includes an MRAM array circuit having a plurality of MTJ cells, a plurality of bit line transfer gates, a plurality of source line transfer gates, a word line, a plurality of transfer devices controlled by the word line, a plurality of bit lines and a plurality of source lines. A first end of each respective MTJ cell is connected to a respective bit line connected to a first end of a respective bit line transfer gate, a second end of each respective MTJ cell is connected to a first electrode of a respective transfer device controlled by the word line and the word line is connected to a control electrode of each respective transfer device and second electrode of each respective transfer device is connected to a respective source line connected to a first end of a respective source line transfer gate. A master bit line is connected to a second end of each bit line transfer gate. A first bit line control transistor has a first electrode connected to VDD and a second electrode. A source follower transistor has a first electrode connected to the second electrode of the first bit line control transistor, a second electrode connected to the master bit line and a control electrode connected to a write 0 bias voltage. A second bit line control transistor has a first electrode connected to VSS and a second electrode connected to the master bit line.

In one embodiment, the MRAM bit line write control circuit also includes a master source line connected to a second end of each respective source line transfer gate, a first source line control transistor having a first electrode connected to the master source line and a second electrode connected to VSS, a second source line control transistor having a first electrode connected to the master source line and a second electrode connected to VDD and a third source line control transistor having a first electrode connected to the master source line and a second electrode connected to a read sense circuit.

In one embodiment, a selected MTJ cell is biased to write a 0 when the word line is driven to a voltage to enable the transfer device associated with the selected MTJ cell, the bit line transfer gate associated with the selected MTJ cell is enabled, the source line transfer gate associated with the selected MTJ cell is enabled, the first bit line control transistor is enabled to connect the source follower transistor to VDD to enable the operation of the source follower transistor.

In one embodiment, a selected MTJ cell is biased to write a 1 when the word line is driven to a voltage to enable the transfer device associated with the selected MTJ cell, the bit line transfer gate associated with the selected MTJ cell is enabled, the source line transfer gate associated with the selected MTJ cell is enabled, the second source line control transistor is enabled and the second bit line control transistor is enabled. In one embodiment, the word line is biased in such a way to use the transfer device as a source follower, and the gate of transfer device (the word line) is used to control the write 1 voltage across the MTJ.

In one embodiment, a selected MTJ cell is biased to read a 1 or 0 when the word line is driven to a voltage to enable the transfer device associated with the selected MTJ cell, the bit line transfer gate associated with the selected MTJ cell is enabled, the source line transfer gate associated with the selected MTJ cell is enabled, the second bit line control transistor is enabled and the third source line control transistor is enabled.

In one embodiment, a method of writing to an MRAM including an MRAM array circuit includes selecting a first MTJ cell; driving the word line to a voltage to enable the transfer device associated with the selected first MTJ cell; enabling the bit line transfer gate associated with the selected first MTJ cell; enabling the source line transfer gate associated with the selected first MTJ cell; enabling the first bit line control transistor to connect the source follower transistor to VDD to enable the operation of the source follower transistor, wherein the selected first MTJ cell is biased to write a 0.

In one embodiment, a method of writing to an MRAM including an MRAM array circuit includes selecting a second MTJ cell; driving the word line to a voltage to enable the transfer device associated with the selected second MTJ cell; enabling the bit line transfer gate associated with the selected second MTJ cell; enabling the source line transfer gate associated with the selected second MTJ cell; enabling the second source line control transistor; and enabling the second bit line control transistor; wherein the selected second MTJ cell is biased to write a 1. In one embodiment, the word line is biased in such a way to use the transfer device as a source follower, and the gate of transfer device (the word line) is used to control the write 1 voltage across the MTJ.

In one embodiment, a method of writing to an MRAM including an MRAM array circuit includes selecting a third MTJ cell; driving the word line to a voltage to enable the transfer device associated with the selected third MTJ cell; enabling the bit line transfer gate associated with the selected third MTJ cell; enabling the source line transfer gate associated with the selected third MTJ cell; enabling the second bit line control transistor; and enabling the third source line control transistor; wherein the selected third MTJ cell is biased to read a 1 or 0.

Further features as well as the structure and operation of various embodiments are described in detail below with reference to the accompanying drawings. In the drawings, like reference numbers indicate identical or functionally similar elements.

DETAILED DESCRIPTION OF PREFERRED EMBODIMENTS

In one embodiment, an MRAM bit line control circuit includes a source follower transistor placed in the bit line decode path for writing a 0 value to an MTJ. In one embodiment, a high voltage n-type device is added in series with each bit line acting as a source follower. In one embodiment, the gate of the source follower device is connected to a bias voltage to control the voltage across the MTJ. The gate bias of the NFET controls the bit lines during a write 0 operation. The high voltage properties of the FET allows a sufficiently high voltage be applied to the bit lines of the MRAM array circuit.

Figure 1:
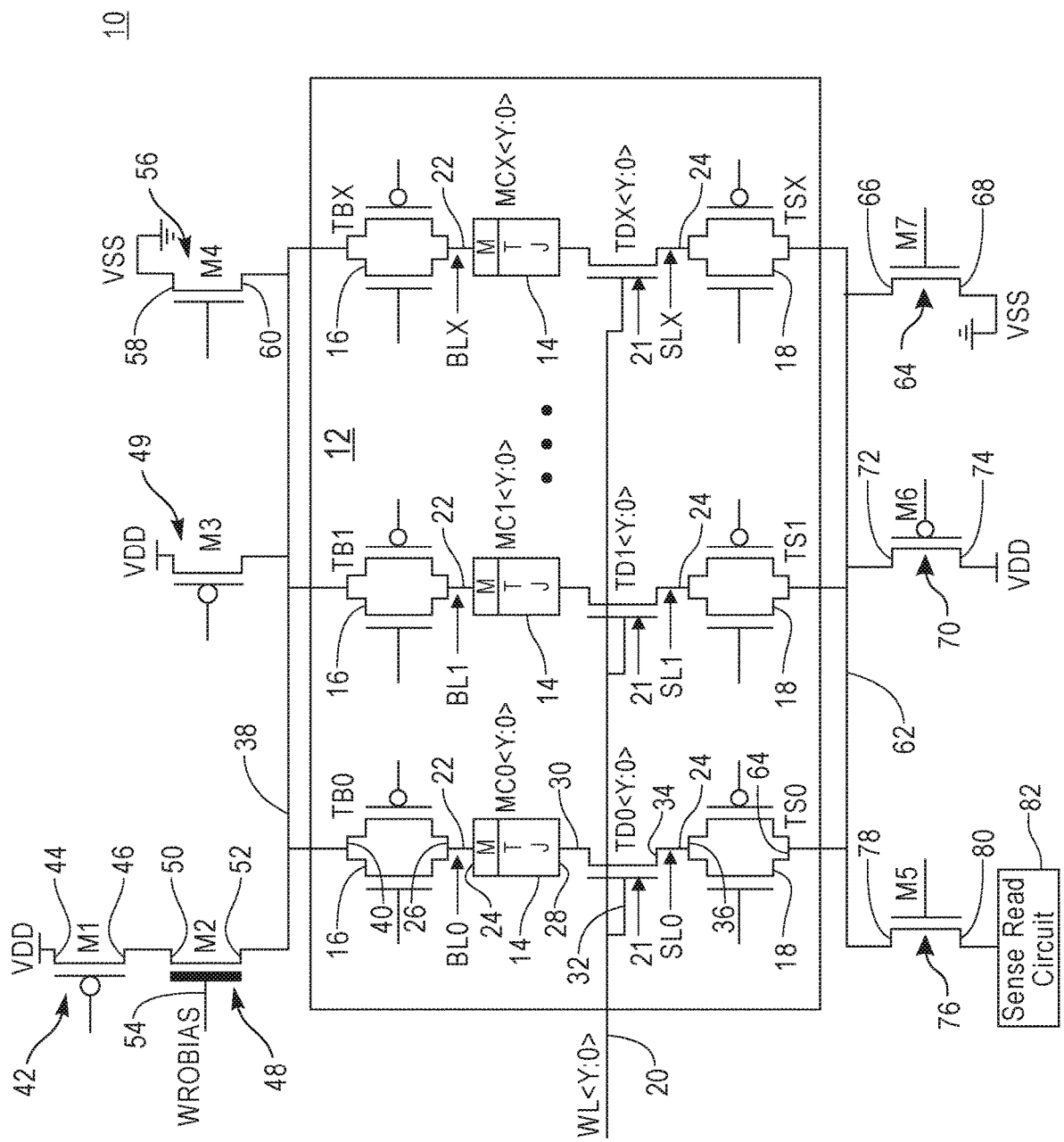
FIG. 1 is a circuit diagram of one embodiment of the MRAM array circuit disclosed in this specification.

FIG. 1 is a circuit diagram of one embodiment of an MRAM bit line write control circuit 10. The circuit 10 of FIG. 1 is one embodiment of a configuration of transistors, MRAM cells, and transfer gates used for decoding a single MTJ cell and either Writing it to a "1" state, a "0" state, or sensing the resistance of the cell. The circuit 10 includes an MRAM array circuit 12. The MRAM array circuit 12 includes a plurality of MTJ cells 14, labeled MC0, MC1, ... MCX. The circuit 12 also includes a plurality of bit line transfer gates 16, labeled TB0, TB1, ... TBX. The circuit 12 also includes a plurality of source line transfer gates 18, labeled TS0, TS1 ... TSX. The circuit 12 also includes a word line 20 and a plurality of transfer devices 21, controlled by the word line 20, labeled TD0, TD1 ... TDX. The circuit 12 also includes a plurality of bit lines 22, labeled BL0, BL1 ... BLX and a plurality of source lines 24, labeled SL0, SL1 ... SLX. In one embodiment, the bit line transfer gates 16 and the source line transfer gates 18 are comprised of an NFET and a PFET connected in parallel. In one embodiment, the transfer device is an NFET.

As shown in FIG. 1, a first end 24 of each respective MTJ cell 14 is connected to a respective bit line 22, which is connected to a first end 26 of a respective bit line transfer gate 16. A second end 28 of each respective MTJ cell 14 is connected to a first electrode 30 of a respective transfer device 21 controlled by the word line 20. The word line 20 is connected to a gate control electrode 32 of each respective transfer device 21. A second electrode 34 of each respective transfer device 21 is connected to a respective source line 24 which is connected to a first end 36 of a respective source line transfer gate 18.

A master bit line 38 is connected to a second end 40 of each bit line transfer gate 16. A first bit line control transistor M1, 42, has a first electrode 44 connected to VDD and a second electrode. A source follower transistor M2, 48 has a first electrode 50 connected to the second electrode 46 of the first bit line control transistor 42 and a second electrode 52 connected to the master bit line 38. A gate control electrode 54 of the source follower transistor 48 is connected to a write 0 bias voltage WROBIAS. A second bit line control transistor M4, 56 has a first electrode 58 connected to VSS and a second electrode 60 connected to the master bit line 38. A third transistor M3, 49 connects the master bit line to VDD in a standby state.

A master source line 62 is connected to a second end 64 of each respective source line transfer gate 18. A first source line control transistor M7, 64 has a first electrode 66 connected to the master source line 62 and a second electrode 66 connected to VSS. A second source line control transistor M6, 70 has a first electrode 72 connected to the master source line 62 and a second electrode 74 connected to VDD. A third source line control transistor M5, 76 has a first electrode 78 connected to the master source line 62 and a second electrode 80 connected to a sense/read circuit 82.

Figure 2:
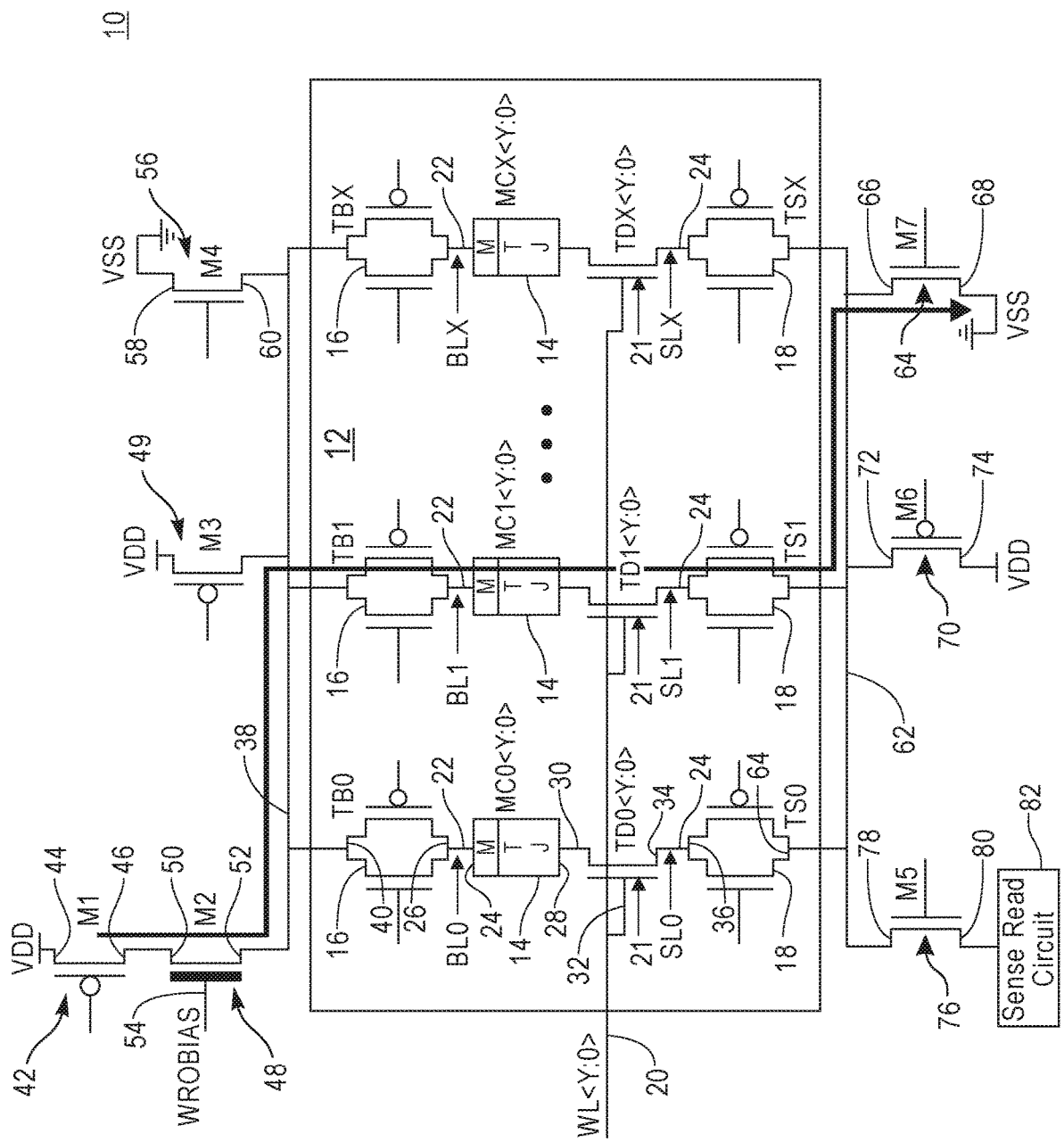
FIG. 2 is a circuit diagram of one embodiment of the MRAM array circuit showing write 0 biasing disclosed in this specification.

In operation, as shown in FIG. 2, a selected MTJ cell is biased to write a 0 when the word line is driven to a voltage to enable the transfer device associated with the selected MTJ cell, the bit line transfer gate associated with the selected MTJ cell is enabled, the source line transfer gate associated with the selected MTJ cell is enabled, the first source line control transistor is enabled thereby enabling the operation of the source follower transistor, and the first bit line control transistor is enabled.

The voltage WROBIAS is generated by a system not shown and is regulated to a value that is approximately equal to the desired voltage of the master source line 38 during a write 0 plus an additional high voltage. In one embodiment, transistor M2 is a high voltage NFET realized as a thicker oxide device. Transistor M2 should be a high voltage NFET because of the elevated gate voltage necessary to use M2 in a source follower configuration. By selecting different combinations of source line controlling transistors and bit line controlling transistors, different modes of operation can be asserted.

In one mode of operation, a selected MTJ cell 14 is biased to write a 0 when the word line 20 is driven to a voltage to enable the transfer device 21 associated with the selected MTJ cell 14, the bit line transfer gate 16 associated with the selected MTJ cell 14 is enabled, the source line transfer gate 18 associated with the selected MTJ cell 14 is enabled, the first bit line control transistor M1, 42 is enabled to connect the source follower transistor M1, 48 to VDD to enable the operation of the transistor M2, 48 as a source follower.

FIG. 2 is one example of biasing an MTJ cell for writing a "0" state. First, a single MTJ memory cell 14, MC1 is selected. To select MTJ cell MC1, the single word line 20 is driven to a voltage to enable the transfer device 21, TD1. The voltage should be high enough to minimize the voltage drop across the transfer device TD1. Additionally, a single bit line transfer gate TB1 and a single source line transfer gate TS1 are selected, connecting the single bit line BL1 to the master bit line 38 and the single source line SL1 to the master source line 62. Transistor M7 is then enabled to connect the master source line 62 to ground/VSS. Transistor M1, 48 is then enabled to connect the drain 50 of M2 to VDD, hence enabling the operation of M2 as a source follower. The master bit line 38 is then driven to approximately WROBIAS minus the threshold voltage of M2. In this way, the value of WROBIAS can be adjusted to control the value of the master bit line 38 for appropriate write voltage.

In another mode of operation, a selected MTJ cell 14 is biased to write a 1 when the word line 20 is driven to a voltage to enable the transfer device 21 associated with the selected MTJ cell 14, the bit line transfer gate 16 associated with the selected MTJ cell 14 is enabled, the source line transfer gate 18 associated with the selected MTJ cell 14 is enabled, the second source line control transistor M6, 70 is enabled and the second bit line control transistor M4, 56 is enabled. The word line 20 is biased in such a way to use the transfer device 21 as a source follower, and the gate of transfer device 21 (the word line 20) is used to control the write 1 voltage across the MTJ 14.

Figure 3:
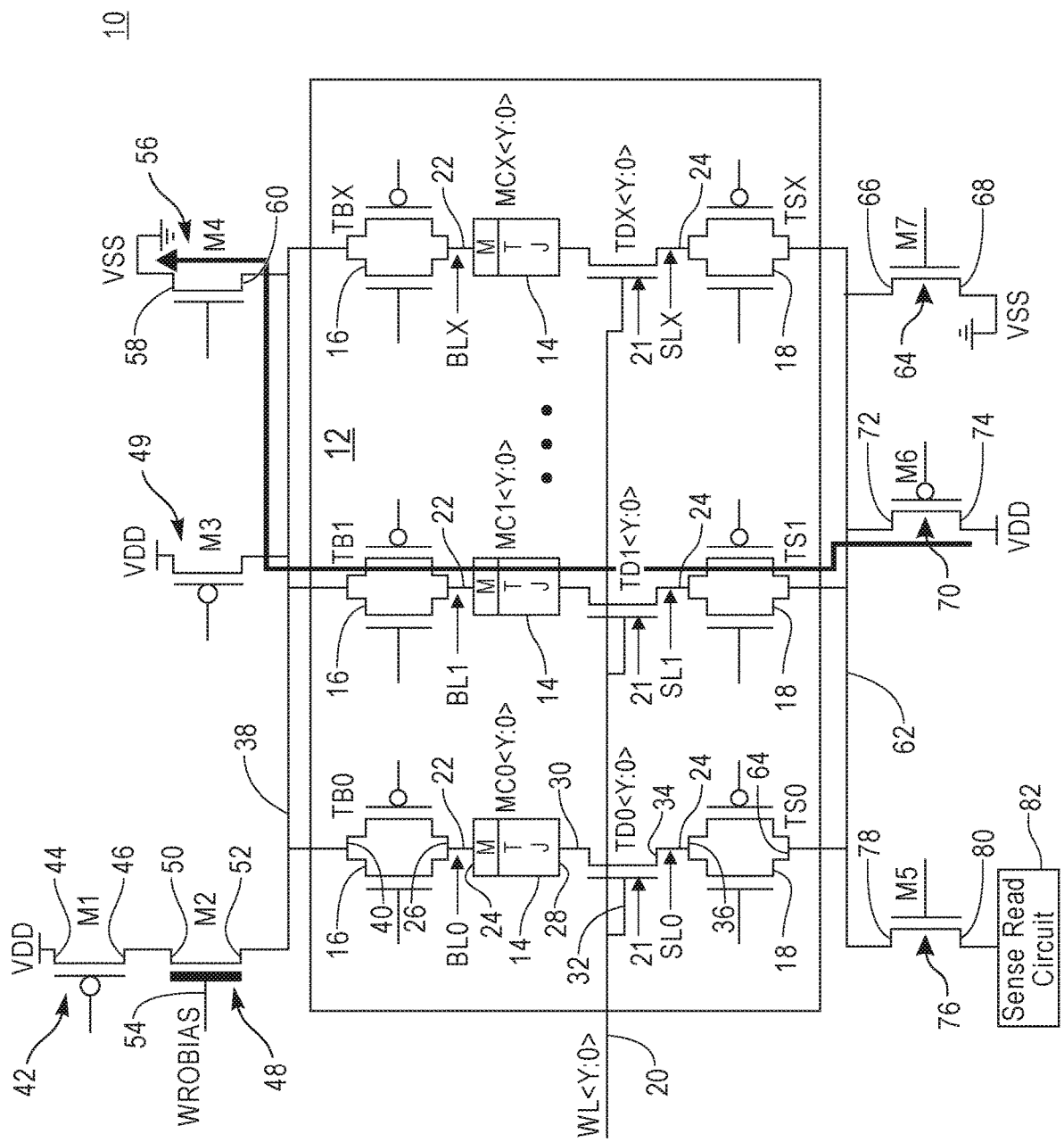
FIG. 3 is a circuit diagram of one embodiment of the MRAM array circuit showing write 1 biasing disclosed in this specification.

FIG. 3 is one example of biasing an MTJ cell 14 for writing a "1" state. A single MTJ memory cell 14, MC1 is selected. To select cell MC1, the single word line 20 is driven to a voltage to enable the transfer device TD1. The voltage for the word line 20 in this condition is driven to a voltage level approximately equal to the desired positive bias of the MTJ MC1 plus the threshold voltage of the transfer device TD1. Therefore, word line 20 is biased in such a way to use the transfer device 21, TD1 as a source follower. In addition, the gate 32 of the transfer device 21, TD1 is used to control the write 1 voltage across the MTJ. In this way the value of the word line 20 voltage can be adjusted to control the bias across the MTJ cell MC1 for appropriate write voltage. Additionally, a single bit line transfer gate TB1 and a single source line transfer gate TS1 are selected, connecting a single bit line BL1 to the master bit line 38 and a single source line SL1 to the master source line 62. Transistor M4 is then enabled to connect the master bit line 38 to ground/VSS. Transistor M6 is enabled to connect the master source line 62 to VDD In another mode of operation, a selected MTJ cell 14 is biased to read a 1 or 0 when the word line 20 is driven to a voltage to enable the transfer device 21 associated with the selected MTJ cell 14, the bit line transfer gate 16 associated with the selected MTJ cell 14 is enabled, the source line transfer gate 18 associated with the selected MTJ cell 14 is enabled, the second bit line control transistor M4, 56 is enabled and the third source line control transistor M5, 76 is enabled.

Figure 4:
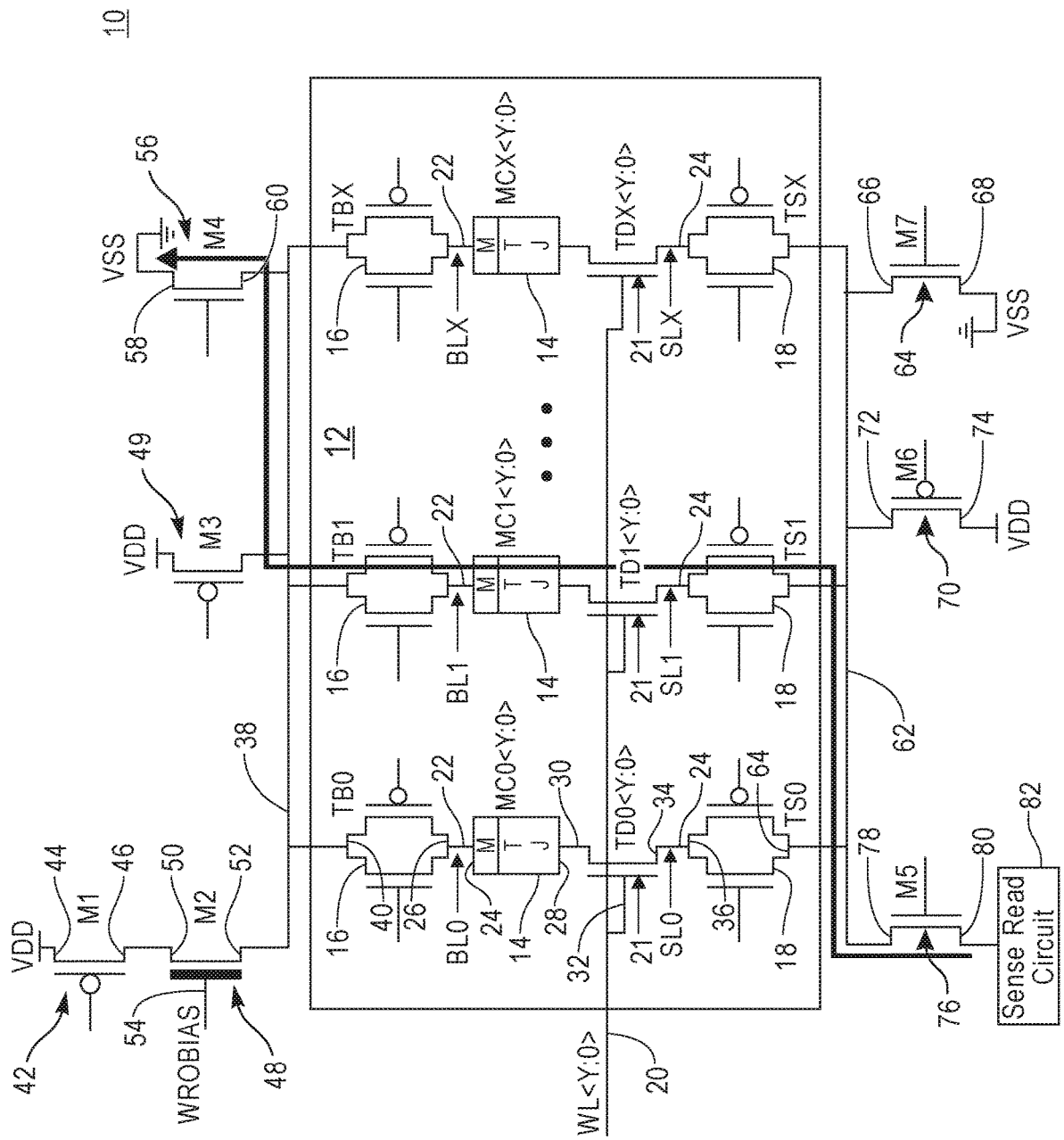
FIG. 4 is a circuit diagram of one embodiment of the MRAM array circuit showing read biasing disclosed in this specification.

FIG. 4 is one example of sensing/reading the value of the MTJ. A single MTJ memory cell MC1 is selected. To select cell MC1, the single word line 20 is driven to a voltage to enable the transfer device TD1. The voltage is high enough to minimize voltage drop across the transfer device TD1. Additionally, the single bit line transfer gate TB1 and a single source line transfer gate TS1 are selected, connecting the single bit line BL1 to the master bit line 38 and the single source line SL1 to the master source line 62. Transistor M4 is enabled to short the master bit line 38 to ground/VSS. Transistor M5 is enabled to connect the master source line 62 to sense circuitry 82.

The MRAM bit line write control circuit allows the transfer devices 21 to act as a source follower during a write 1 operation and allows the word line 20 voltage to control the bias of the MTJs 14 in such a condition. Because the WROBIAS value controls the value of the master bit line 38, it is possible for the drain 50 of M2 to be connected via M1 to an unregulated supply, for example directly from a pad, which can alleviate design consideration by eliminating the need of a regulator, or reducing noise off of an alternate regulated supply. Thus, there is no need for a high accuracy, high current, high bandwidth regulator as in some prior art designs. The regulator design would need to be a high power regulator to meet the bandwidth requirements, and would also need to have a large output driver, making it a challenging design that would also be expensive in terms of area and power.

In addition, there is no need of an addition track of metal for power supply. In the circuit design disclosed herein, because a high current power supply is not needed, other supplies or signals are able to be routed instead.

In the circuit design disclosed herein, because the source follower is controlled primarily by the BIAS voltage applied to the gate, the power supply can have some variation and still produce an accurate voltage for writing of the MTJ, thereby reducing potential problems caused by a power supply IR drop.

In the circuit design disclosed herein, since the gate of the source follower does not consume any DC current, the circuit that produces this value can be slower, a smaller driver and lower power compared to a true power supply regulator. In the circuit design disclosed herein, because adding more MTJ cells does not place much of an additional circuit change to the power delivery system, scaling the number of MTJs written is a more scalable design than a true power supply.

The circuit design disclosed herein allows VDD to be used for power source since the voltage across MTJ is determined by value of the BIAS voltage.

In the circuit design disclosed herein, using a source follower as compared to a switch and accurate power supply provides a more accurate, higher efficiency and scalable design for writing the Write 0 state of an MTJ device. Moreover it also is consistent with the method necessary to write in the Write 1 state. This also limits the control for write current to two voltage references, the BIAS voltage for Write 0 and the word line voltage for Write 1.

In one embodiment, the circuit design disclosed herein uses of a high voltage NFET FET M2 and allows the gate bias of the NFET M2 to control the master bit line 38 during a write 0 operation. The high voltage properties of the NFET M2 allow a sufficiently high voltage to be applied to the master bit line 38. All other FETS in circuit 10 are lower voltage FETS, such as thin oxide FETs, which allows for a higher density. Device M2 being a high voltage device would also be placed on a pitch with a certain number of bit lines.

In one embodiment, the circuit design disclosed herein allows the transfer device 21 to act as a source follower during a write 1 operation and allows the word line 20 voltage to control the bias of the MTJ 14 in such a condition.

The circuit design disclosed herein connects the bias voltage directly to the gate the source follower and does not sample the bias voltage on a capacitor which is connected to the gate. The circuit design disclosed herein uses the array NFET as a source follower in one data state and the source follower in bit decode to write in the other mode. The circuit design disclosed herein does not use a PFET source follower or both a PFET and NFET source follower. The circuit design disclosed herein bypasses the source follower when reading and uses a different writing path for the writing of the state '1' and does not use the same path for writing the '0' and '1, i.e., only one path from decode to cell that goes through the bit decode.

Figure 5:
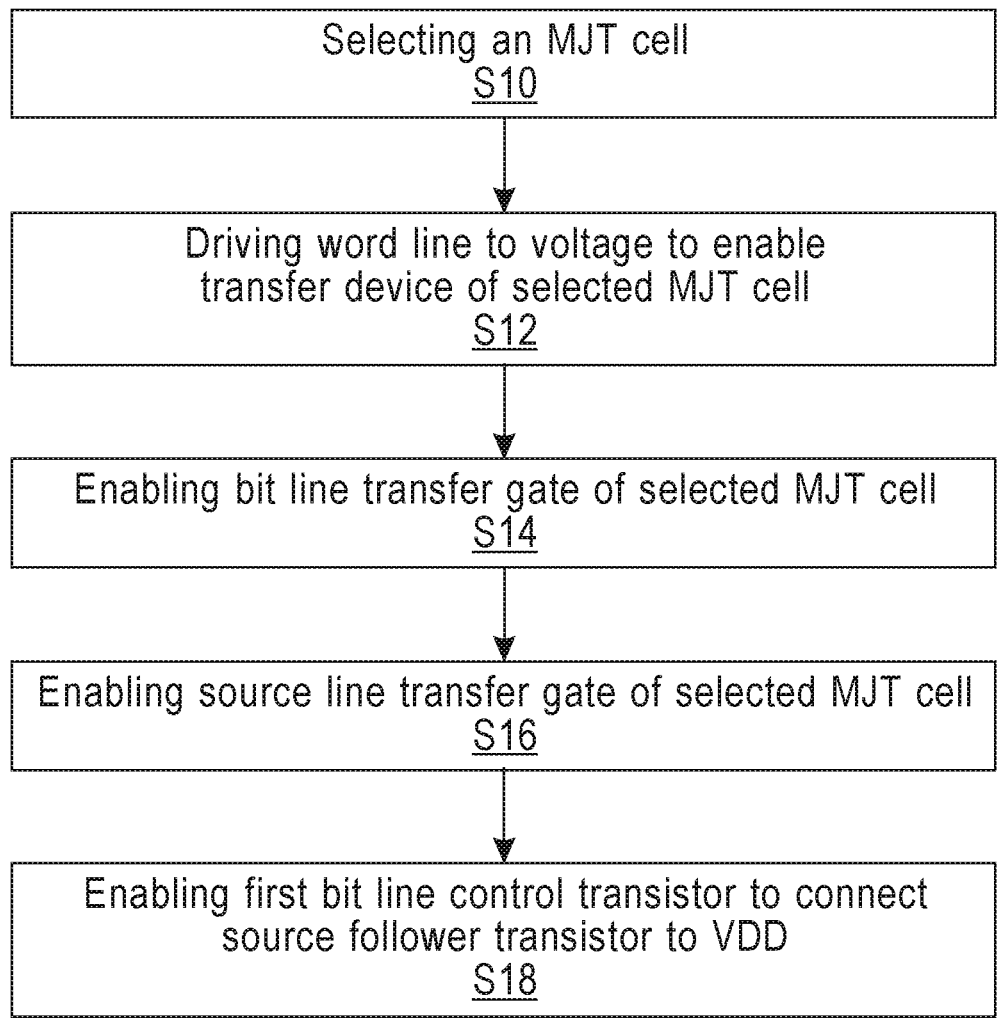
FIG. 5 is a flow diagram of one embodiment of the method of writing to an MRAM with write 0 biasing disclosed in this specification.

FIG. 5 is a flow diagram of one embodiment of a method of writing to an MRAM including an MRAM array circuit wherein a selected first MTJ cell is biased to write a 0. The method includes step S10 of selecting an MTJ cell; step S12 of driving the word line to a voltage to enable the transfer device associated with the selected MTJ cell; step S14 of enabling the bit line transfer gate associated with the selected MTJ cell; step S16 of enabling the source line transfer gate associated with the selected MTJ cell; and step S18 of enabling the first bit line control transistor to connect the source follower transistor to VDD to enable the operation of the source follower transistor.

Figure 6:
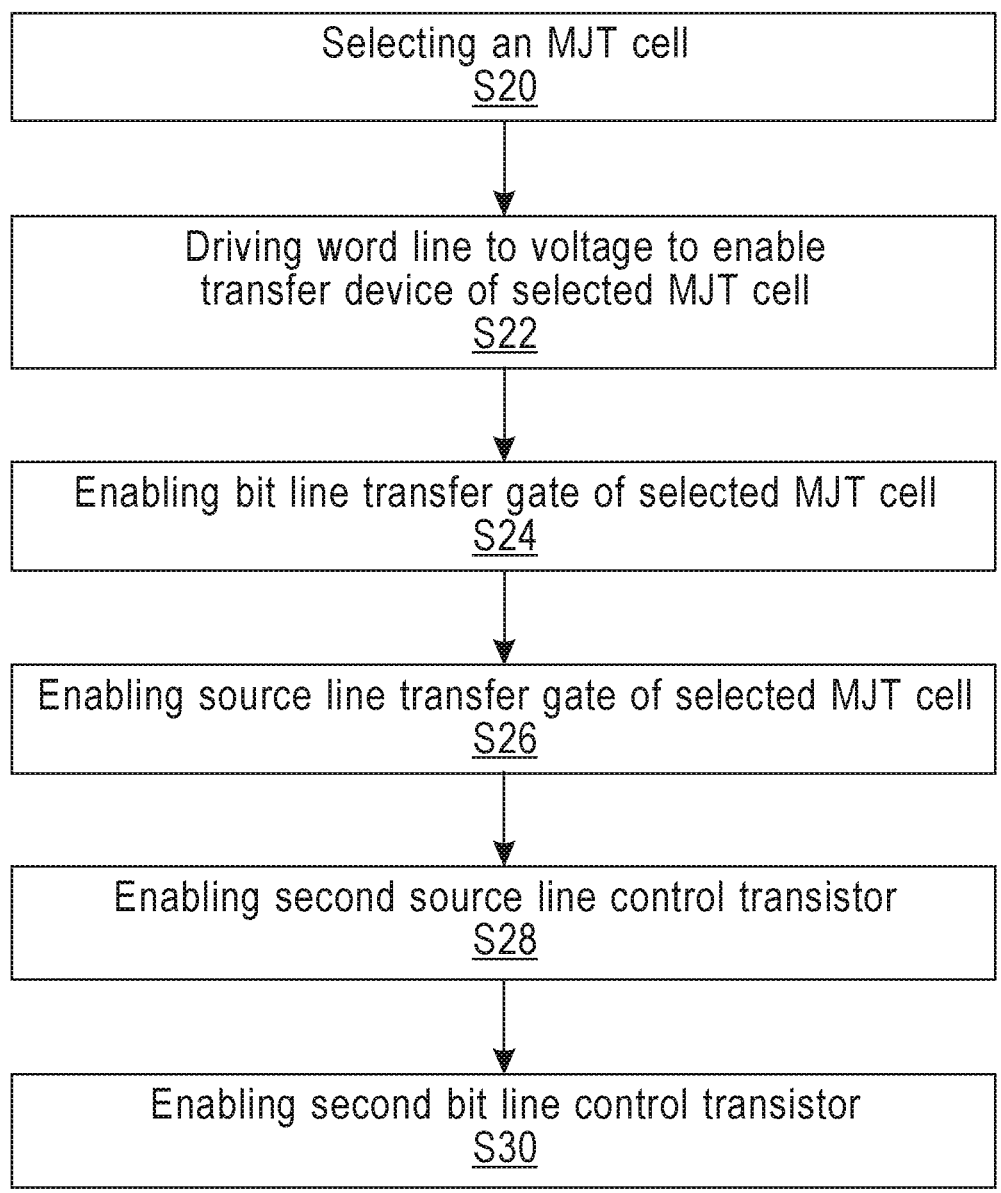
FIG. 6 is a flow diagram of one embodiment of the method of writing to an MRAM with write 1 biasing disclosed in this specification.

FIG. 6 is a flow diagram of one embodiment of a method of writing to an MRAM including an MRAM array circuit wherein a selected MTJ cell is biased to write a 1. The method includes step S20 of selecting an MTJ cell; step S22 of driving the word line to a voltage to enable the transfer device associated with the selected MTJ cell; step S24 of enabling the bit line transfer gate associated with the selected MTJ cell; step S26 of enabling the source line transfer gate associated with the selected MTJ cell; step S28 of enabling the second source line control transistor; and step S30 of enabling the second bit line control transistor.

Figure 7:
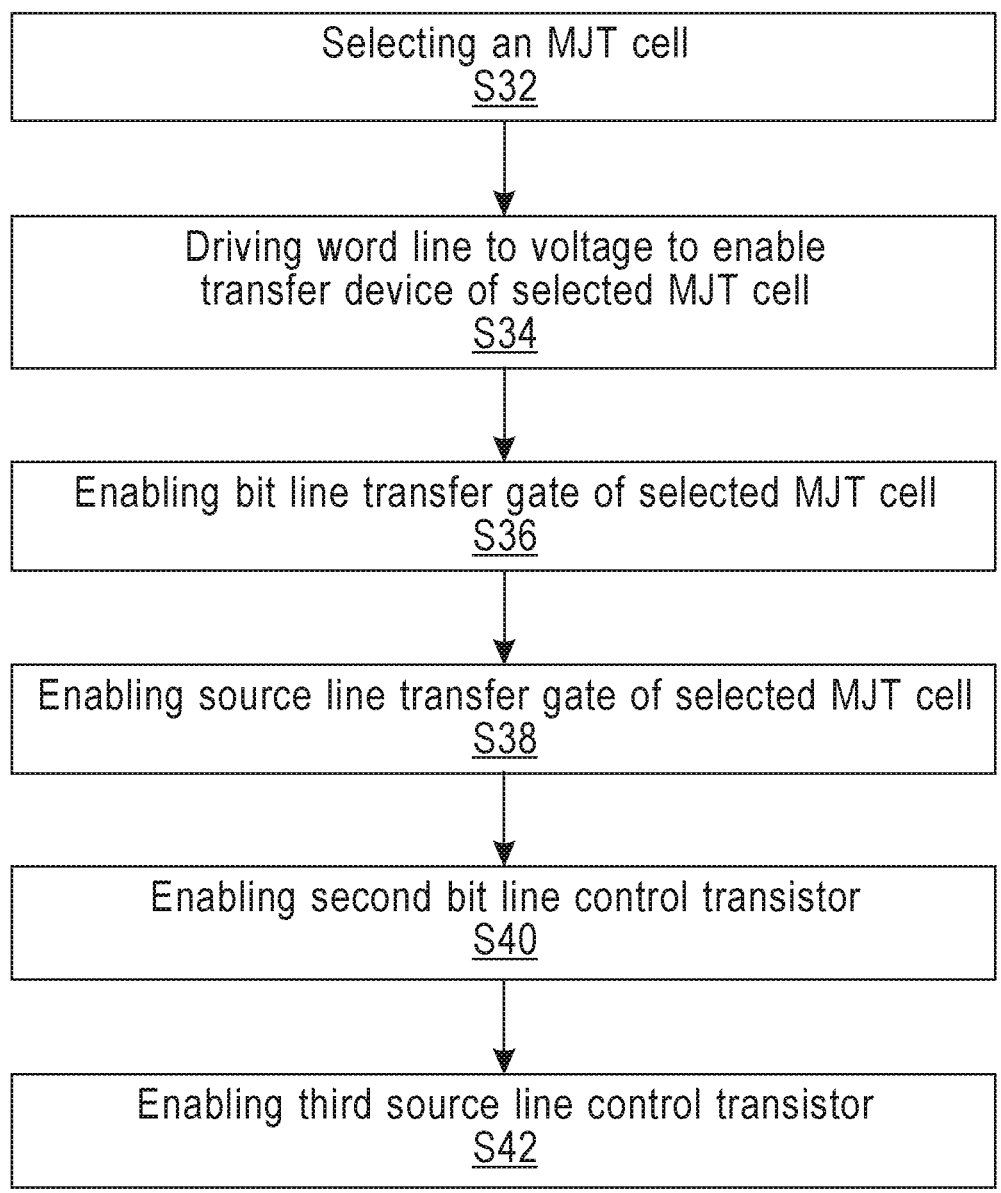
FIG. 7 is a flow diagram of one embodiment of the method of writing to an MRAM with read biasing disclosed in this specification.

FIG. 7 is a flow diagram of one embodiment of a method of writing to an MRAM including an MRAM array circuit wherein a selected MTJ cell is biased to read a 1 or 0. The method includes step S32 of selecting an MTJ cell; step S34 of driving the word line to a voltage to enable the transfer device associated with the selected MTJ cell; step S36 of enabling the bit line transfer gate associated with the selected MTJ cell; step S38 of enabling the source line transfer gate associated with the selected MTJ cell; step S40 of enabling the second bit line control transistor; and step S42 of enabling the third source line control transistor.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

In addition, while preferred embodiments of the present invention have been described using specific terms, such description is for illustrative purposes only, and it is to be understood that changes and variations may be made without departing from the spirit or scope of the following claims.

What is claimed is:

1. An MRAM bit line write control circuit comprising:
an MRAM array circuit comprising:
a plurality of MTJ cells, a plurality of bit line transfer gates, a plurality of source line transfer gates, a word line, a plurality of transfer devices controlled by the word line, a plurality of bit lines, and a plurality of source lines,
a first bit line control transistor having a first electrode connected to VDD and a second electrode; and
a source follower transistor having a first electrode connected to the second electrode of the first bit line control transistor, a second electrode connected to a master bit line and a control electrode connected to a write 0 bias voltage;
wherein a selected MTJ cell is biased to write a 0 when the word line is driven to a voltage to enable the transfer device associated with the selected MTJ cell, the bit line transfer gate associated with the selected MTJ cell is enabled, the source line transfer gate associated with the selected MTJ cell is enabled, the first bit line control transistor is enabled to connect the source follower transistor to VDD to enable the operation of the source follower transistor.

2. The MRAM bit line write control circuit of claim 1, further comprising: the master bit line connected to a second end of each bit line transfer gate; a first bit line control transistor having a first electrode connected to VDD and a second electrode; a second bit line control transistor having a first electrode connected to VSS and a second electrode connected to the master bit line; a master source line connected to a second end of each respective source line transfer gate; a first source line control transistor having a first electrode connected to the master source line and a second electrode connected to VSS; a second source line control transistor having a first electrode connected to the master source line and a second electrode connected to VDD; and a third source line control transistor having a first electrode connected to the master source line and a second electrode connected to a read sense circuit; wherein a selected MTJ cell is biased to write a 1 when the word line is driven to a voltage to enable the transfer device associated with the selected MTJ cell, the bit line transfer gate associated with the selected MTJ cell is enabled, the source line transfer gate associated with the selected MTJ cell is enabled, the second source line control transistor is enabled and the second bit line control transistor is enabled.

3. The MRAM bit line write control circuit of claim 2, wherein the transfer device associated with the selected MTJ cell operates as a source follower when the selected MTJ cell is biased to write a 1.

4. The MRAM bit line write control circuit of claim 3, wherein the word line voltage controls the bias of the selected MTJ cell.

5. The MRAM bit line write control circuit of claim 1, wherein a selected MTJ cell is biased to read a 1 or 0 when the word line is driven to a voltage to enable the transfer device associated with the selected MTJ cell, the bit line transfer gate associated with the selected MTJ cell is enabled, the source line transfer gate associated with the selected MTJ cell is enabled, the second bit line control transistor is enabled and the third source line control transistor is enabled.

6. The MRAM bit line write control circuit of claim 1, wherein the source follower transistor is an NFET.

7. The MRAM bit line write control circuit of claim 1, wherein the source follower transistor is a high voltage NFET.

8. The MRAM bit line write control circuit of claim 1, wherein the master bit line is driven to the write 0 bias voltage minus the threshold voltage of the source follower transistor when the selected MTJ cell is biased to write a 0.

9. The MRAM bit line write control circuit of claim 1, wherein the bit line transfer gates and the source line transfer gates are comprised of an NFET and a PFET connected in parallel.

10. The MRAM bit line write control circuit of claim 1, wherein the transfer device is an NFET.

11. A method of writing to an MRAM including an MRAM array circuit comprising a plurality of MTJ cells, a plurality of bit line transfer gates, a plurality of source line transfer gates, a word line, a plurality of transfer devices controlled by the word line, a plurality of bit lines, and a plurality of source lines, a first bit line control transistor having a first electrode connected to VDD and a second electrode; and a source follower transistor having a first electrode connected to the second electrode of the first bit line control transistor, a second electrode connected to a master bit line and a control electrode connected to a write 0 bias voltage; the method comprising:
selecting a first MTJ cell;
driving the word line to a voltage to enable the transfer device associated with the selected first MTJ cell;
enabling the bit line transfer gate associated with the selected first MTJ cell;
enabling the source line transfer gate associated with the selected first MTJ cell;
enabling the first bit line control transistor to connect the source follower transistor to VDD to enable the operation of the source follower transistor,
wherein the selected first MTJ cell is biased to write a 0.

12. The method of claim 11, further comprising:
selecting a second MTJ cell;
driving the word line to a voltage to enable the transfer device associated with the selected second MTJ cell;
enabling the bit line transfer gate associated with the selected second MTJ cell;
enabling the source line transfer gate associated with the selected second MTJ cell;
enabling a source line control transistor; and
enabling a bit line control transistor;
wherein the selected second MTJ cell is biased to write a 1.

13. The method of claim 12, further comprising:
selecting a third MTJ cell;
driving the word line to a voltage to enable the transfer device associated with the selected third MTJ cell;
enabling the bit line transfer gate associated with the selected third MTJ cell;
enabling the source line transfer gate associated with the selected third MTJ cell;
enabling a second bit line control transistor; and
enabling a second source line control transistor;
wherein the selected third MTJ cell is biased to read a 1 or 0.

14. The method of claim 12, wherein the transfer device associated with the selected MTJ cell operates as a source follower when the selected MTJ cell is biased to write a 1.

15. The method of claim 14, wherein the word line voltage controls the bias of the selected MTJ cell.

16. The method of claim 11, wherein the source follower transistor is an NFET.

17. The method of claim 11, wherein the source follower transistor is a high voltage NFET.

18. The method of claim 11, wherein the master bit line is driven to the write 0 bias voltage minus the threshold voltage of the source follower transistor when the selected MTJ cell is biased to write a 0.

19. The method of claim 11, wherein the bit line transfer gates and the source line transfer gates are comprised of an NFET and a PFET connected in parallel.

20. The method of claim 11, wherein the transfer device is an NFET.

* * * * *